United States Patent [19]
Cullumber

[11] Patent Number: 5,729,564
[45] Date of Patent: Mar. 17, 1998

[54] ELECTROSTATIC PRECIPITATOR FOR A GAS DISCHARGE LASER

[75] Inventor: David I. Cullumber, Fremont, Calif.

[73] Assignee: VISX, Incorporated, Santa Clara, Calif.

[21] Appl. No.: 688,715

[22] Filed: Jul. 31, 1996

[51] Int. Cl.$^6$ ............................................. H01S 3/22
[52] U.S. Cl. ............................ 372/58; 372/98; 372/34
[58] Field of Search ........................... 372/58, 59, 55, 372/81, 82, 34

[56] References Cited

U.S. PATENT DOCUMENTS

| | | |
|---|---|---|
| 3,704,053 | 11/1972 | Farmer . |
| 4,096,449 | 6/1978 | Foster ............................ 372/58 |
| 4,099,143 | 7/1978 | Foster ............................ 372/58 |
| 4,534,034 | 8/1985 | Hohla et al. . |
| 4,571,730 | 2/1986 | Mizoguchi et al. ............ 372/58 |
| 4,611,270 | 9/1986 | Klauminzer et al. . |
| 4,734,916 | 3/1988 | Hoag ............................... 372/58 |
| 4,771,436 | 9/1988 | Koseki ............................ 372/58 |
| 4,791,637 | 12/1988 | Kimura .......................... 372/58 |
| 4,835,785 | 5/1989 | Thayer ........................... 372/58 |
| 4,959,840 | 9/1990 | Akins et al. . |
| 4,970,383 | 11/1990 | Candle et al. . |
| 4,977,573 | 12/1990 | Bittenson et al. . |
| 5,048,041 | 9/1991 | Akins et al. . |
| 5,180,404 | 1/1993 | Loreth et al. . |
| 5,319,663 | 6/1994 | Reid et al. ..................... 372/58 |
| 5,359,620 | 10/1994 | Akins . |

FOREIGN PATENT DOCUMENTS 61-152007 A  10/1994  Japan .

*Primary Examiner*—Leon Scott, Jr.
*Attorney, Agent, or Firm*—Townsend and Townsend and Crew LLP

[57] ABSTRACT

An electrostatic precipitator is provided within the housing of a gas discharge laser, such as an exciter laser, to collect and trap dust particles generated in the course of laser operation. The precipitator comprises a plurality of spaced collector plates mounted within the laser housing for flow-through passage of a lasing gas circulated by a fan through a laser discharge zone disposed between a pair of main electrodes. The collector plates are appropriately charged to define one precipitator pole, the opposite pole being defined by the laser discharge zone and the ionization and fluorescent discharge associated therewith during laser operation. The collector plates are shaped and spaced for changing the lasing gas flow direction and for reducing the flow velocity as the lasing gas circulates between the plates, to achieve enhanced electrostatic collection of dust. The collector plates additionally include capture troughs for capturing dust particles that are attracted to the plate surfaces but otherwise not retained by electrostatic forces.

32 Claims, 2 Drawing Sheets

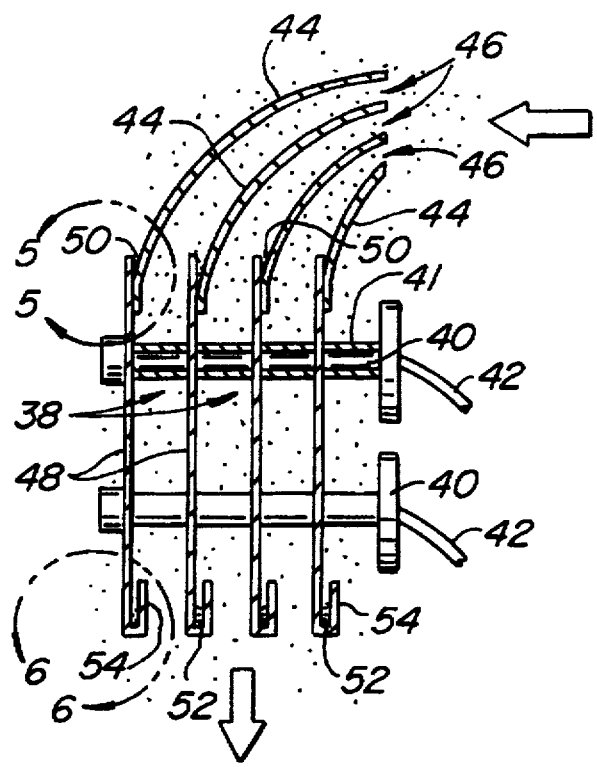
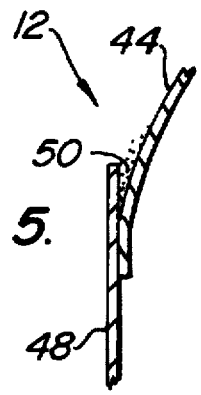
FIG. 5.
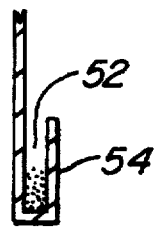
FIG. 6.
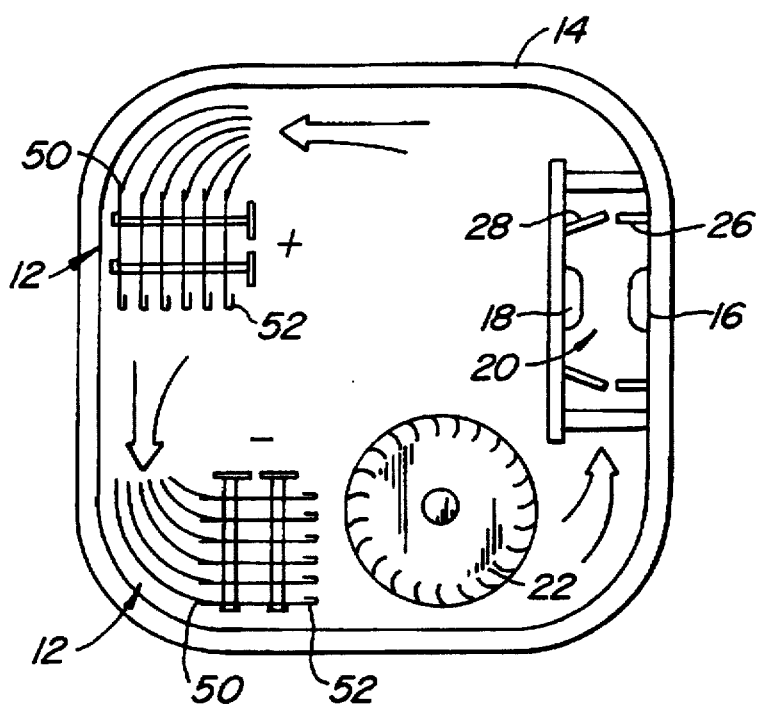
FIG. 7.

ELECTROSTATIC PRECIPITATOR FOR A GAS DISCHARGE LASER

BACKGROUND OF THE INVENTION

This invention relates generally to improvements in gas discharge lasers, particularly with respect to the collection and/or filtration of dust particles generated during normal laser operation. More specifically, this invention relates to an improved electrostatic precipitator mounted directly within the housing of a gas discharge laser to collect and trap dust particles.

Gas discharge lasers are generally known in the art wherein a lasing gas is excited by an electrical power source to generate a relatively coherent discharge of light. In a typical configuration, the lasing gas is contained within a substantially closed vessel or housing having a laser discharge zone defined therein between a pair of main laser electrodes. The lasing gas is excited by applying a relatively large voltage, resulting in the generation of light which can be directed and focused through appropriate optic elements to provide a narrow and coherent beam. The laser is normally operated or fired in a pulsed manner by connecting a main electrode circuit to the electrical power source at a selected operating frequency. A circulation fan is commonly provided within the laser housing for flow-through circulation of the lasing gas through the laser discharge zone.

During laser operation, dust particles are generated within the laser housing each time the laser is fired, particularly in an exciter laser. These dust particles are produced by a combination of erosion of metal components such as the main electrodes and/or associated preionization pins in the vicinity of the laser discharge zone, and chemical conversion by the lasing gas. Over time, the generated dust particles coat the surfaces of internal laser components and can interfere with proper laser discharge operation. Moreover, the dust particles can accumulate on the optic elements, resulting in potentially significant reduction in the power of the light beam discharged from the laser housing.

A variety of dust particle collection and/or filtration systems have been proposed in an effort to reduce the impact of dust particle generation on laser operation. Such systems having included, for example, external filtration devices and related gas circulation systems for mechanical filtration and/or electrostatic precipitation to remove dust particles from the lasing gas, followed by gas recirculation to the laser housing. Such systems, however, are relatively complex with respect to the assembly of structural components and related circulation of the lasing gas to and from the laser housing. Moreover, external filtration devices normally rely upon greatly reduced gas flow velocities, whereby only a portion of the lasing gas can be filtered at any one time. See, for example, U.S. Pat. Nos. 4,534,034 and 4,959,840. Other proposals having envisioned installation of an electrostatic filtration device directly within the laser housing for flow-through gas circulation during laser operation. However, these devices have not been highly efficient in operation, typically collecting only a small proportion of the generated dust entrained within the gas flow stream during each pass therethrough. See, for example, U.S. Pat. No. 5,319,663.

Accordingly, there exists a continuing need for further improvements in the collection and/or filtration of dust particles generated during operation of a gas discharge laser, particularly with respect to a compact and operationally efficient collection system adapted for mounting directly within the laser housing. The present invention meets these objectives and provides further related advantages.

SUMMARY OF THE INVENTION

In accordance with the invention, a gas discharge laser such as an exciter laser includes an improved electrostatic precipitator mounted directly within a laser housing for collecting and trapping dust particles. The electrostatic precipitator comprises a plurality of collector plates which are appropriately charged to define one precipitator pole, with the opposite precipitator pole being defined by the main laser discharge zone and the ionization and fluorescent discharge associated therewith during laser operation. The collector plates are designed for collecting and trapping generated dust particles by a combination of electrostatic action and mechanical means.

The gas discharge laser includes a substantially closed vessel or housing having the main laser discharge zone defined between a pair of elongated and closely spaced main electrodes and an associated set of preionization pins mounted in the housing. A circulation fan provides a recirculating flow of the lasing gas through the laser discharge zone. The collector plates are mounted within the laser housing for flow-through passage of the lasing gas circulated through the laser discharge zone, wherein the collector plates are preferably positioned in relatively close proximity to the laser discharge zone at a downstream side thereof. The collector plates are mounted in spaced apart relation and include curved segments over at least upstream ends thereof for cooperatively defining a plurality of direction-changing channels of progressively increasing angle of the attack and progressively increasing cross sectional size. As a result, the collector plates turn the gas flow through a bend angle while at the same time reducing the gas flow velocity, to cause the entrained dust particles to move toward outer edges of the inter-plate channels and against the surfaces of the collector plates for electrostatic capture and retention. The collector plates further include capture troughs for mechanically trapping and retaining dust particles which have been attracted to but not otherwise retained by the collector plates.

In one form of the invention, multiple sets of the collector plates may be provided within the laser housing for series flow-through passage of the lasing gas during recirculation thereof to the laser discharge zone. If desired, the series-mounted sets of collector plates may be oppositely charged.

Other features and advantages of the present invention will become more apparent from the following detailed description, taken in conjunction with the accompanying drawings which illustrate, by way of example, the principles of the invention.

BRIEF DESCRIPTION OF THE DRAWINGS

The accompanying drawings illustrate the invention. In such drawings:

FIG. 4 is an enlarged vertical sectional view taken generally on the line 4—4 of FIG. 3;

FIG. 5 is a further enlarged fragmented sectional view corresponding generally with the encircled region 5 of FIG. 4;

FIG. 6 is a further enlarged fragmented sectional view corresponding generally with the encircled region 6 of FIG. 4; and FIG. 7 is a somewhat schematic diagram depicting a gas discharge laser including an electrostatic precipitator constructed in accordance with an alternative preferred form of the invention.

DETAILED DESCRIPTION OF THE PREFERRED EMBODIMENTS

Figure 1:
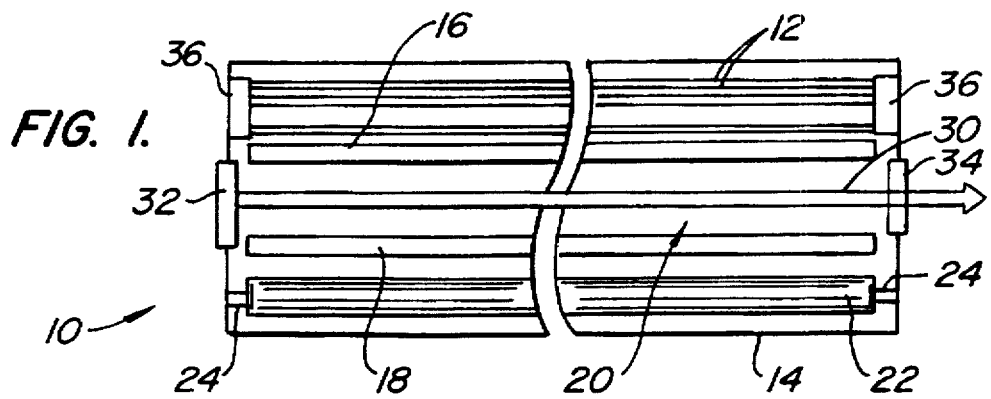
FIG. 1 is a schematic diagram illustrating a gas discharge laser including an electrostatic precipitator constructed in accordance with the present invention.

As shown in the exemplary drawings, a gas discharge laser referred to generally by the reference numeral 10 includes an improved electrostatic precipitator for collecting and trapping dust particles generated during normal laser operation. The electrostatic precipitator comprises collector means in the form of a set of charged collector plates 12 which function to collect and trap generated dust particles by a combination of electrostatic action and mechanical means.

Figure 2:
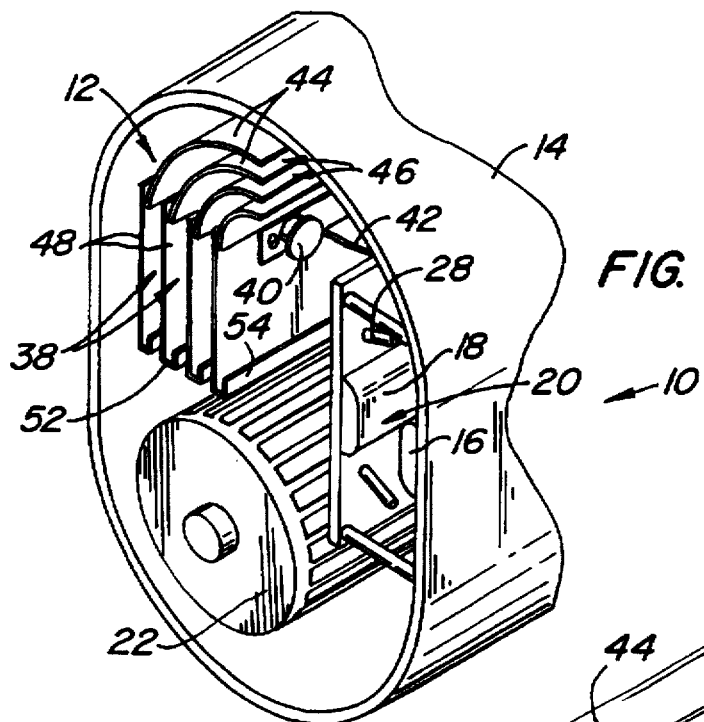
FIG. 2 is an enlarged fragmented perspective view illustrating the internal components of the gas discharge laser shown in FIG. 1.

FIGS. 1 and 2 illustrate the collector plates 12 mounted within the housing 14 of the gas discharge laser 10, particularly such as an exciter laser having an otherwise conventional construction. In this regard, as shown, the housing 14 comprises a substantially closed and longitudinally elongated vessel with a pair of elongated and closely spaced main laser electrodes 16 and 18 mounted therein. These main electrodes 16, 18 define a laser discharge zone 20 disposed therebetween, wherein this discharge zone 20 has an open-sided configuration for flow-through circulation of a selected lasing gas. An elongated circulation fan 22, normally end-supported from the housing 14 by appropriate bearings 24, is provided for circulating the lasing gas within the housing 14 through the laser discharge zone 20. In operation, the lasing gas is excited by applying a relatively large voltage across the electrodes 16, 18, with relatively small preionization pins 26 and 28 being normally provided in association with the electrodes to initiate laser firing which then normally proceeds in a pulsating manner at a selected frequency. Light generated by the excited gas at the laser discharge zone 20 is directed by appropriate optical elements to exit the housing 14 as a narrow and coherent beam 30, with FIG. 1 depicting a reflector 32 at one end of the housing in combination with a window or lens 34 at an opposite end of the housing.

In general terms, the collector plates 12 are provided in relatively close proximity to the laser discharge zone 20, at a downstream location for interacting with the lasing gas circulated from the laser discharge zone, and at an upstream location relative to the fan 22. In accordance with the invention, the collector plates 12 cooperate with the laser discharge zone 20 to define an effective and efficient electrostatic precipitator for collecting and trapping dust particles generated during normal laser operation.

Figure 3:
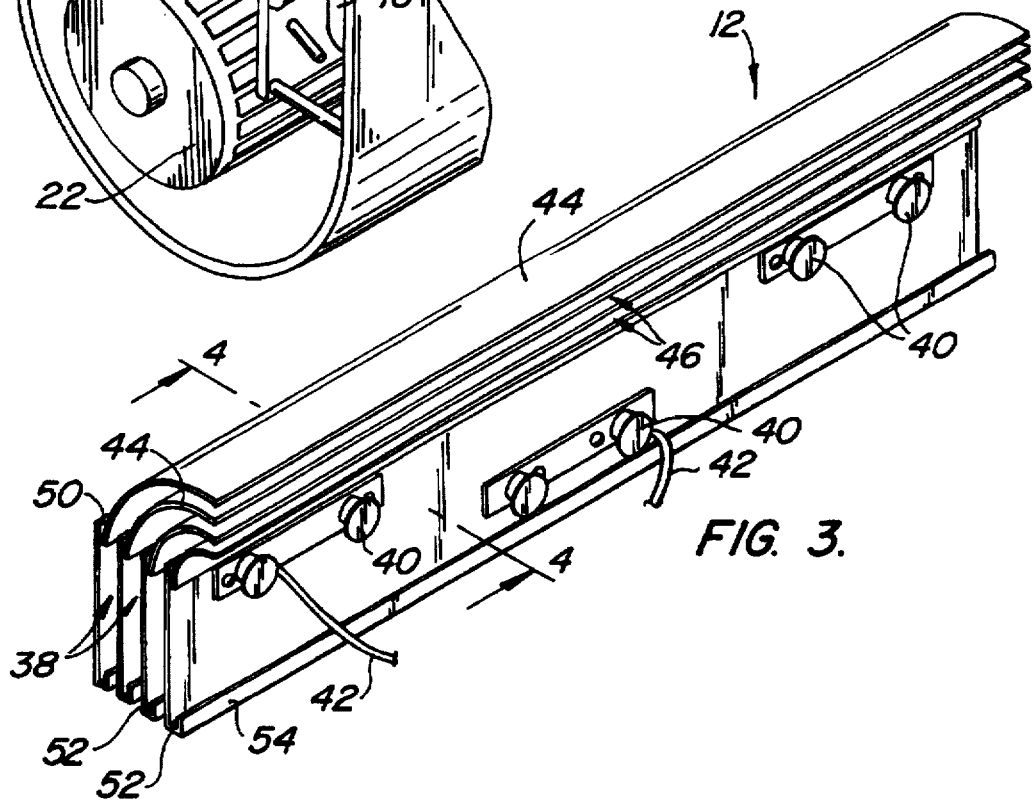
FIG. 3 is a perspective view depicting a set of collector plates forming a portion of the electrostatic precipitator.

More specifically, the collector plates 12 are supported within the housing 14 by insulated end mounts 36 (FIG. 1) or the like and extend longitudinally through the housing 14 in a spaced-apart array to define a plurality of relatively narrow flow channels 38 for flow-through passage of the lasing gas. FIGS. 2–4 illustrate a set of four collector plates 12, which are formed from a conductive material such as aluminum or the like, assembled and retained in fixed spaced-apart array by a plurality of headed support pins 40 with spacer sleeves 41 thereon (FIG. 4) to retain the plates 12 at a desired spacing. These support pins 40 are adapted for connection by suitable conductors 42 to an appropriate electrical power source. Accordingly, the collector plates 12 can be electrically charged, such as by connection to a positive DC voltage on the order of about 1–10 kilovolts (kv).

The collector plates 12 define curved segments 44 over at least the upstream ends thereof. These curved plate segments 44 cooperatively form a plurality of relatively narrow entrance throats 46 at the upstream ends of the inter-plate flow channels 38. From these narrow entrance throats 46, the curved plate segments 44 transition through an angular bend of about ninety degrees, with an increasing angle of attack by forming the segments 44 so that the impingement angle between the gas flow and the plate segments increases through the length of the bend. With this configuration, the flow channels 38 progressively increase in cross sectional size while at the same time progressively turning through the bend angle of about ninety degrees. This combination of directional change and widening flow channel causes dust particles entrained within the gas stream flowing through the channels 38 to move outwardly by inertia toward the outer edges of the channels 38 for physical contact with the surfaces of the collector plates. This migration of the dust particles toward the plate surfaces, in combination with the reduced flow velocity attributable to the widening channels enhances the ability of electrostatic forces to attract and retain the dust particles on the collector plates 12.

Electrostatic action occurs as a result of the laser firing at the laser discharge zone 20. This laser firing ionizes the gas and excites the gas molecules to a higher energy level, with fluorescence occurring as the excited molecules decay and emit photons. The ionized molecules at this location tend to be electrostatically attracted to and attached by dust particles which are carried by the circulating gas flow stream from the laser discharge zone 20. These combined fluorescence and ionization effects at the discharge zone 20 represent one pole of an electrostatic precipitator. The second pole of the electrostatic precipitator is represented by the set of charged collector plates 12.

The collector plates 12 thus electrostatically attract and capture the charged dust particles exiting the laser discharge zone 20 as the lasing gas is circulated through the housing 14. The dust particles are directed by inertia into surface contact with the collector plates, as previously described. By reducing the gas flow velocity through the inter-plate flow channels 38, the proportion of charged particles which can be electrostatically captured by the plates is increased.

In one preferred collection plate geometry, the curved plate segments 44 define the narrow entrance throats 46 each having an inter-plate width on the order of about 0.25 inch. The collector plates 12 are each formed with a progressively increasing radius of curvature toward the outside of the approximate ninety degree bend, with a progressive increase in flow channel width to about 0.50 inch at the conclusion of the bend. The median length of the flow channels 38 defined by the curved segments 44 is about three inches. As shown in the preferred form, the downstream ends of the curved plate segments 44 are respectively joined to flat or linear segments 48 mounted in generally parallel relation by the support pins 40 and cooperatively defining uniform width continuations of the flow channels 38 which extend the channel lengths for about three additional inches.

In accordance with a primary aspect of the invention, the collector plates 12 additionally include capture troughs for mechanically capturing charged dust particles flowing through the channels 38 but not otherwise electrostatically captured and retained. In the preferred form, each collector plate 12 includes a pair of capture troughs 50 and 52 disposed on opposite sides thereof, and at different positions along the length of the inter-plate flow channels 38. A first trough 50 is shown in FIGS. 2–4 at the juncture of the curved upstream plate segment 44 and the downstream flat segment 48, wherein the trough 50 is located on the outboard or convex side of the plate 12. A second capture trough 52 is disposed at the downstream end of the flat collector plate segment 48, on the inboard surface thereof by appropriate shaping of the plate to include a narrow upturned lip 54.

In operation, it has been discovered that a significant portion of the dust particles flowing through the inter-plate channels 38 tend to be attracted and/or otherwise tend to move by inertia into contact or at least into close proximity with the surfaces of the collection plates 12. However, a significant portion of these dust particles will resist electrostatic retention and instead will tend to tumble along the plate surfaces without effective capture. In some cases, captured particles can be dislodged and re-entrained in the gas flow stream as a result of gas and particles flowing through the channels. The capture troughs 50, 52, provide an effective and efficient mechanical filtration structure for retaining these dust particles.

More specifically, as shown best in FIGS. 4–6, the upstream ends of the flat plate segments 48 project in an overlying fashion slightly beyond the downstream ends of the curved plate segments 44 to define the capture troughs 50. These capture troughs 50 each have a upstream-opening narrow entrance, with a width of about 0.10–0.15 inch, and effectively capture dust particles tumbling along or near the collection plates 12 at the inside edges of the bend in the flow channels 38. Similarly, the downstream ends of the flat plate segments 48 include the upturned lips 54 which define the capture troughs 52 at the outside or outboard edges of the flow channels 38. This latter set of capture troughs 52, also having a narrow upstream-opening entrances of about 0.10–0.15 inch in width, effectively capture dust particles tumbling along or near the collection plates 12 at the outside of the flow channels.

FIG. 7 illustrates one alternative preferred form of the invention, wherein two sets of the charged collector plates 12 are mounted within the laser housing 14, for series-flow of the lasing gas as it is circulated by a fan 22 to a laser discharge zone 20 disposed between a pair of main electrodes 16, 18. As shown in FIG. 7, the two sets of charged electrode plates can be connected to a DC voltage of opposite polarity for electrostatically capturing charged particles of opposite charge. As shown, both sets of the charged collector plates include a group of six plates 12 defining the plurality of inter-plate flow channels 38 of direction-changing and increasing cross sectional size, in combination with the capture troughs 50, 52, as previously shown and described with respect to FIGS. 1–6.

A variety of further modifications and improvements to the invention will be apparent to those persons skilled in the art. Accordingly, no limitation on the invention is intended by way of the foregoing description and accompanying drawings, except as set forth in the appended claims.

What is claimed:

1. An electrostatic precipitator for a gas discharge laser having a lasing gas within a substantially closed housing, a pair of main electrodes mounted within said housing and defining a laser discharge zone therebetween for firing the lasing gas and producing ionization and fluorescent discharge associated therewith at said laser discharge zone, and means for circulating the lasing gas through the laser discharge zone, said electrostatic precipitator comprising:

charged collector means mounted within said housing for flow passage of the lasing gas circulated through the laser discharge zone, said charged collector means and said ionization and fluorescent discharge defining opposite poles of the electrostatic precipitator.

2. The electrostatic precipitator of claim 1 wherein said charged collector means is positioned in close proximity to the laser discharge zone at a downstream side thereof for flow passage of the lasing gas circulated from the laser discharge zone.

3. The electrostatic precipitator of claim 2 wherein said circulating means comprises a fan mounted within said housing, said charged collector means being positioned upstream relative to said fan.

4. The electrostatic precipitator of claim 1 wherein said charged collector means comprises at least one set of charged collector plates mounted within said housing in spaced array to cooperatively define a plurality of inter-plate flow channels for flow-through passage of the lasing gas.

5. The electrostatic precipitator of claim 4 wherein said collector plates include curved segments defining said flow channels with a bend therein for changing the direction of flow of the lasing gas.

6. The electrostatic precipitator of claim 5 wherein said collector plates are mounted to define said flow channels each having a narrow entrance throat and progressively increasing in cross sectional width over at least a portion of the length thereof.

7. The electrostatic precipitator of claim 6 wherein said flow channels increase in width through said bend.

8. The electrostatic precipitator of claim 6 wherein said collector pates further include flat segments disposed at downstream ends of said curved segments, said flat segments defining said flow channels of substantially uniform cross sectional width.

9. The electrostatic precipitator of claim 8 wherein said flat segments of said collector plates include upturned lips at the downstream ends thereof to define capture troughs disposed within said flow channels and opening in an upstream direction.

10. The electrostatic precipitator of claim 9 wherein said capture troughs are positioned along the outboard edges of said flow channels relative to said bend.

11. The electrostatic precipitator of claim 10 wherein said flat segments of said collector plates have upstream ends cooperating with downstream ends of said curved segments to define additional capture troughs positioned along the inboard edges of said flow channels relative to said bend.

12. The electrostatic precipitator of claim 5 wherein said curved segments define said flow channels with an increasing angle of attack.

13. The electrostatic precipitator of claim 4 wherein said collector plates define at least one capture trough disposed within each of said flow channels and opening in an upstream direction for capturing and retaining dust particles carried by the lasing gas through said flow channels.

14. The electrostatic precipitator of claim 13 wherein each of said collector plates defines a pair of said capture troughs disposed on opposite sides thereof.

15. The electrostatic precipitator of claim 4 wherein said collector plates define a pair of said capture troughs disposed within each of said flow channels at opposite edges of said flow channels.

16. The electrostatic precipitator of claim 4 wherein said charged collector means comprises at least two of said sets of charged collector plates mounted within said housing for series-flow passage of the lasing gas.

17. The electrostatic precipitator of claim 16 wherein said two sets of collector plates are oppositely charged.

18. An electrostatic precipitator for a gas discharge laser having a lasing gas within a substantially closed housing, a pair of main electrodes mounted within said housing and defining a laser discharge zone therebetween for firing the lasing gas and producing ionization and fluorescent discharge associated therewith at said laser discharge zone, and means for circulating the lasing gas through the laser discharge zone, said electrostatic precipitator comprising:

at least one set of charged collector plates mounted within said housing in spaced array to cooperatively define a plurality of inter-plate flow channels for flow-through passage of the lasing gas, said collector plates having curved segments defining said flow channels with a direction-changing bend therein, said collector plates being mounted to define said flow channels each having a narrow entrance throat and progressively increasing in cross sectional width through said bend.

19. The electrostatic precipitator of claim 18 wherein said set of collector plates and said ionization and fluorescent discharge define opposite poles of the electrostatic precipitator.

20. The electrostatic precipitator of claim 18 wherein said set of collector plates is positioned in close proximity to the laser discharge zone at a downstream side thereof for flow passage of the lasing gas circulated from the laser discharge zone.

21. The electrostatic precipitator of claim 18 wherein said collector plates define at least one capture trough disposed within each of said flow channels and opening in an upstream direction for capturing and retaining dust particles carried by the lasing gas through said flow channels.

22. The electrostatic precipitator of claim 21 wherein each of said collector plates defines a pair of said capture troughs disposed on opposite sides thereof.

23. The electrostatic precipitator of claim 18 wherein said collector plates define a pair of said capture troughs disposed within each of said flow channels at opposite edges of said flow channels.

24. The electrostatic precipitator of claim 18 wherein said collector pates further include flat segments disposed at downstream ends of said curved segments, said flat segments defining said flow channels of substantially uniform cross sectional width.

25. The electrostatic precipitator of claim 24 wherein said flat segments of said collector plates include upturned lips at the downstream ends thereof to define capture troughs disposed within said flow channels and opening in an upstream direction.

26. The electrostatic precipitator of claim 25 wherein said capture troughs are positioned along the outboard edges of said flow channels relative to said bend.

27. The electrostatic precipitator of claim 26 wherein said flat segments of said collector plates have upstream ends cooperating with downstream ends of said curved segments to define additional capture troughs positioned along the inboard edges of said flow channels relative to said bend.

28. An electrostatic precipitator for a gas discharge laser having a lasing gas within a substantially closed housing, a pair of main electrodes mounted within said housing and defining a laser discharge zone therebetween for firing the lasing gas and producing ionization and fluorescent discharge associated therewith at said laser discharge zone, and means for circulating the lasing gas through the laser discharge zone, said electrostatic precipitator comprising:

at least one set of charged collector plates mounted within said housing in spaced array to cooperatively define a plurality of inter-plate flow channels for flow-through passage of the lasing gas, said collector plates further defining at least one capture trough disposed within each of said flow channels and opening in an upstream direction for capturing and retaining dust particles carried by the lasing gas through said flow channels.

29. The electrostatic precipitator of claim 28 wherein each of said collector plates defines a pair of said capture troughs disposed on opposite sides thereof.

30. The electrostatic precipitator of claim 28 wherein said collector plates define a pair of said capture troughs disposed within each of said flow channels at opposite edges of said flow channels.

31. The electrostatic precipitator of claim 30 wherein said collector plates include curved segments defining said flow channels with a direction-changing bend therein.

32. The electrostatic precipitator of claim 30 wherein said collector plates are mounted to define said flow channels having a progressively increasing cross sectional width over at least a portion thereof to reduce the flow velocity of the lasing gas.

* * * * *